US011476283B2

(12) United States Patent
Miyamoto et al.

(10) Patent No.: US 11,476,283 B2
(45) Date of Patent: Oct. 18, 2022

(54) DISPLAY DEVICE

(71) Applicant: Japan Display Inc., Tokyo (JP)

(72) Inventors: Motoharu Miyamoto, Tokyo (JP); Yoshinori Aoki, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

(21) Appl. No.: 17/022,578

(22) Filed: Sep. 16, 2020

(65) Prior Publication Data

US 2020/0411564 A1  Dec. 31, 2020

Related U.S. Application Data

(63) Continuation of application No. 16/181,854, filed on Nov. 6, 2018, now Pat. No. 10,811,439.

(30) Foreign Application Priority Data

Nov. 22, 2017 (JP) .............................. JP2017-224365

(51) Int. Cl.
*H01L 27/12* (2006.01)
*G09G 3/3266* (2016.01)

(52) U.S. Cl.
CPC ........ *H01L 27/124* (2013.01); *H01L 27/1244* (2013.01); *H01L 27/1248* (2013.01); *G09G 3/3266* (2013.01)

(58) Field of Classification Search
CPC ........... H01L 51/5228; G02F 1/136227; G02F 1/136286
See application file for complete search history.

(56) References Cited

U.S. PATENT DOCUMENTS

| 5,708,485 | A | 1/1998 | Sato |
| 5,859,683 | A * | 1/1999 | Tagusa .............. G02F 1/136227 |
| | | | 349/138 |
| 7,133,094 | B2 | 11/2006 | Ogawa |
| 9,035,300 | B2 | 5/2015 | Ro |
| 2001/0000755 | A1 | 5/2001 | Hirakata |
| 2001/0005607 | A1 | 6/2001 | Hasegawa |
| 2002/0145116 | A1 | 10/2002 | Choo |
| 2011/0012198 | A1 | 1/2011 | Yagi |
| 2011/0156165 | A1 | 6/2011 | Jang |

(Continued)

FOREIGN PATENT DOCUMENTS

JP          2015-122057          7/2015

OTHER PUBLICATIONS

Office Action dated Aug. 24, 2021 in corresponding Japanese Patent Application No. 2017-224365 (English Translation only), 5 pages.

*Primary Examiner* — Vincent Wall
(74) *Attorney, Agent, or Firm* — Maier & Maier, PLLC

(57) ABSTRACT

According to one embodiment, a display device includes a switching element including a drain electrode, a first insulating film including a first through-hole penetrated to the drain electrode, and being formed of an organic insulating material, a first connection electrode which is in contact with the drain electrode at the first through-hole, and is formed of a metal material, a second insulating film which is located on the first insulating film, is formed of an organic insulating material, and includes a second through-hole penetrated to the first connection electrode, and a pixel electrode electrically connected to the first connection electrode.

6 Claims, 15 Drawing Sheets

(56) References Cited

U.S. PATENT DOCUMENTS

| | | |
|---|---|---|
| 2015/0177880 A1 | 6/2015 | Shin et al. |
| 2015/0325705 A1 | 11/2015 | Choi |
| 2016/0349875 A1 | 12/2016 | Weng |
| 2017/0052417 A1 | 2/2017 | Noh |
| 2017/0153482 A1 | 6/2017 | Miyamoto |
| 2018/0006098 A1* | 1/2018 | Hong .................. H01L 27/3279 |
| 2019/0115561 A1* | 4/2019 | Tang ..................... H01L 27/124 |

* cited by examiner

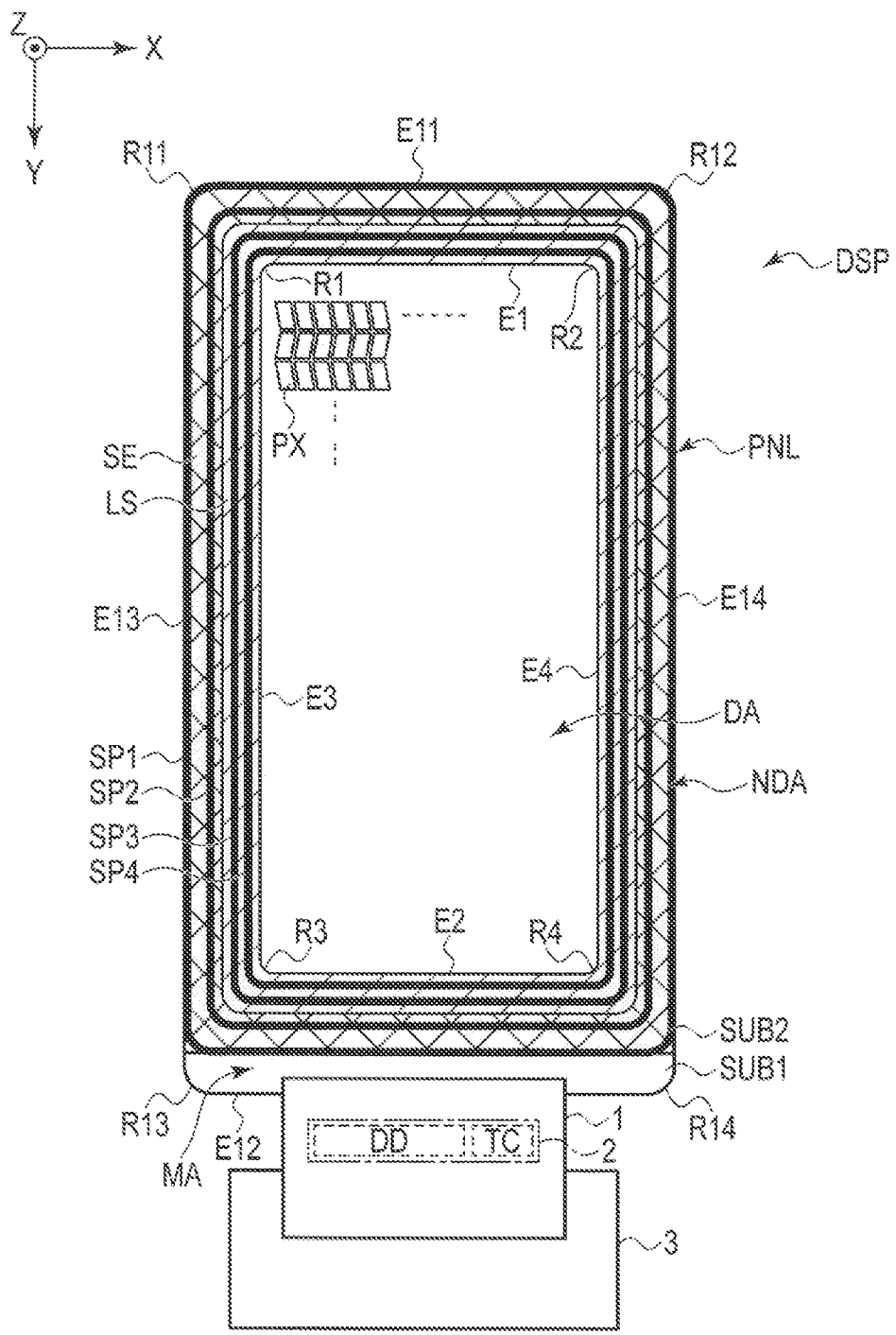
F I G. 1

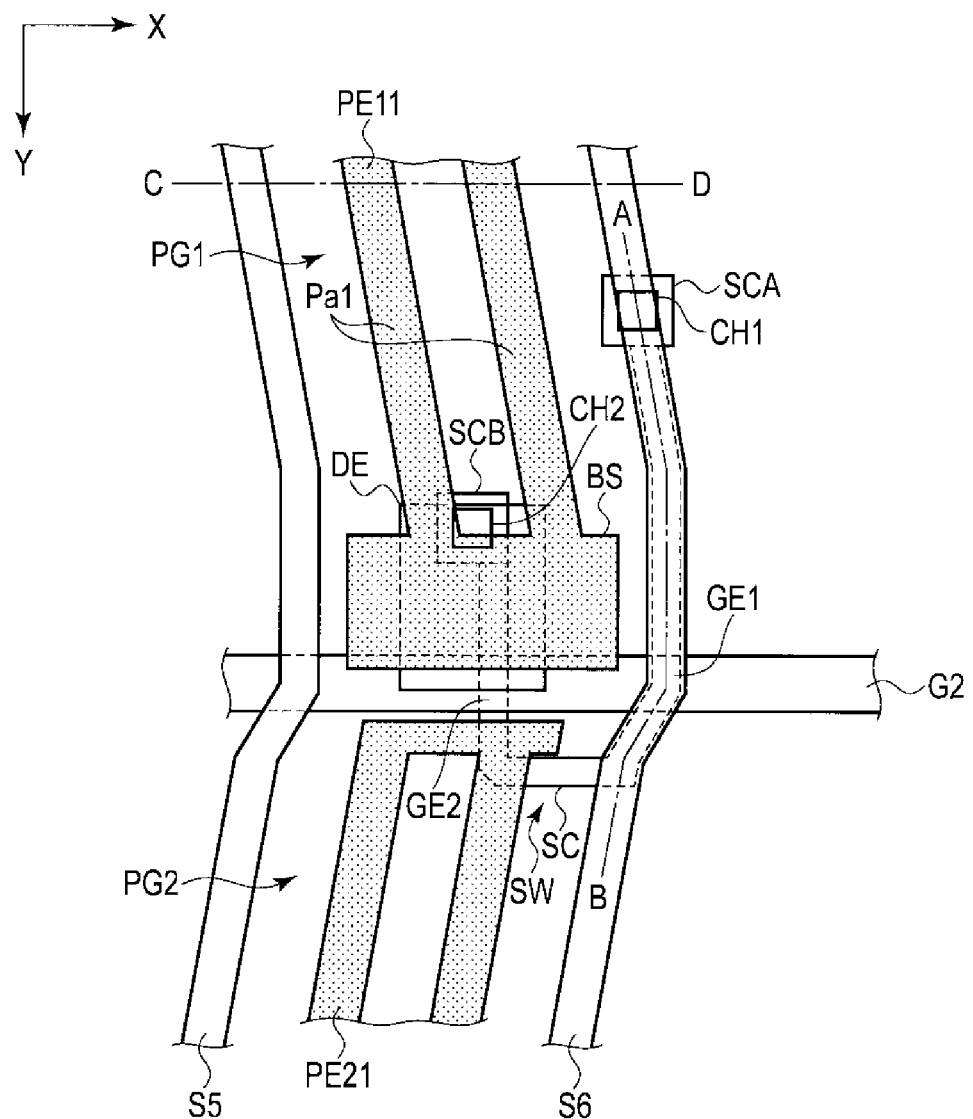
F I G. 7

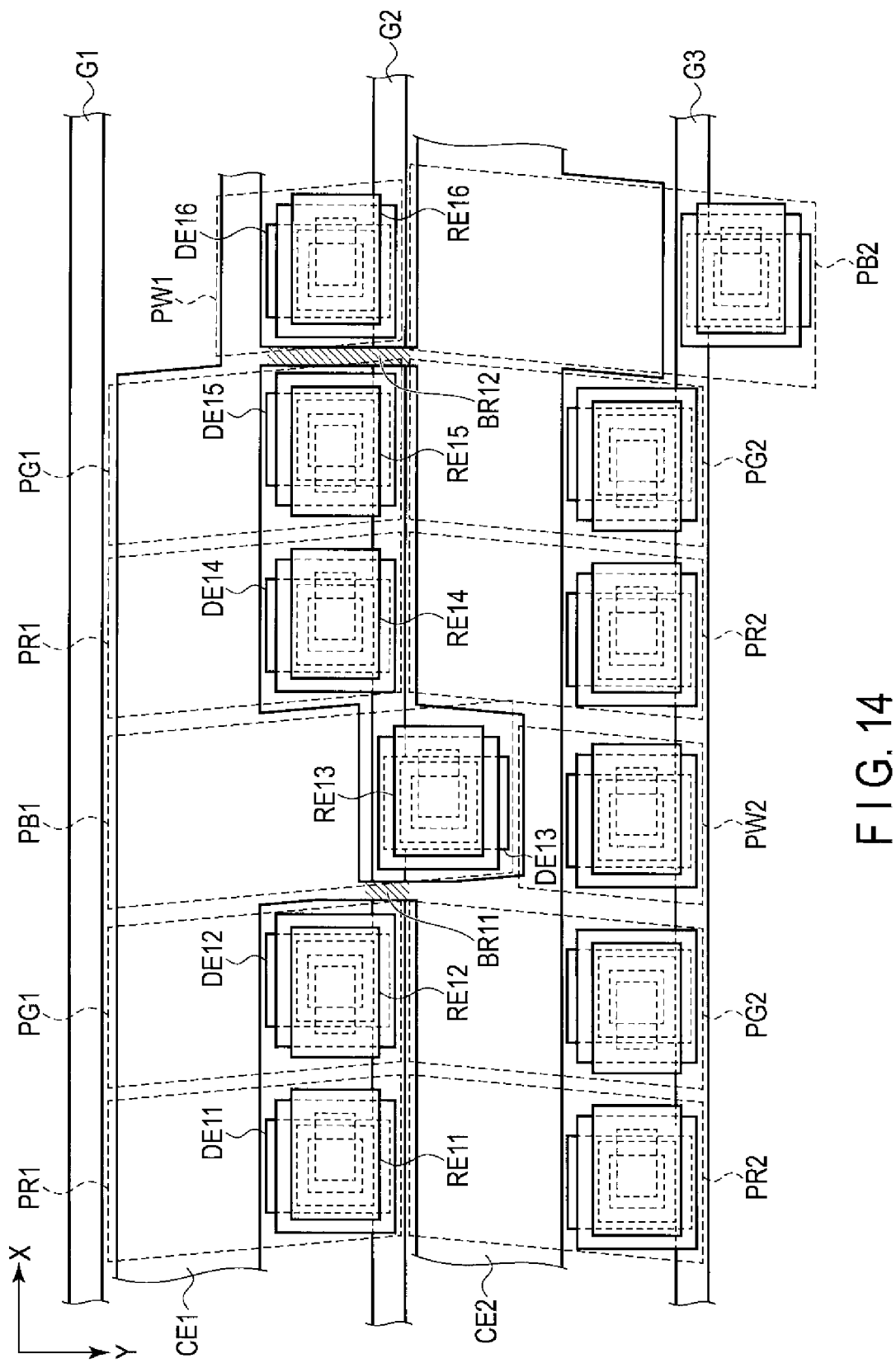
F I G. 14

DISPLAY DEVICE

CROSS-REFERENCE TO RELATED APPLICATIONS

This application is a continuation of U.S. application Ser. No. 16/181,854 filed Nov. 6, 2018, which is based upon and claims the benefit of priority from Japanese Patent Application No. 2017-224365, filed Nov. 22, 2017, the entire contents of each of which are incorporated herein by reference.

FIELD

Embodiments described herein relate generally to a display device.

BACKGROUND

Recently, various display devices in which touch sensors are incorporated have been proposed. In one example, a display device structured such that electrodes formed on a display panel serve as sensor electrodes in the case of a touch sensing mode, and serve as common electrodes in the case of a display mode has been disclosed. As a touch sensing method, either mutual-capacitive sensing or self-capacitive sensing is applied. In the touch sensing mode, sensing is carried out as a touch drive voltage is applied to the sensor electrode through a signal line.

BRIEF DESCRIPTION OF THE DRAWINGS

FIG. 1 is a plan view showing an appearance of a display device DSP of the present embodiment.

FIG. 7 is a plan view showing an example of a pixel shown in FIG. 5.

FIG. 14 is a plan view showing another example of a layout of the common electrodes CE1 and CE2, and the second connection electrodes RE11 to RE16.

DETAILED DESCRIPTION

Figure 2:
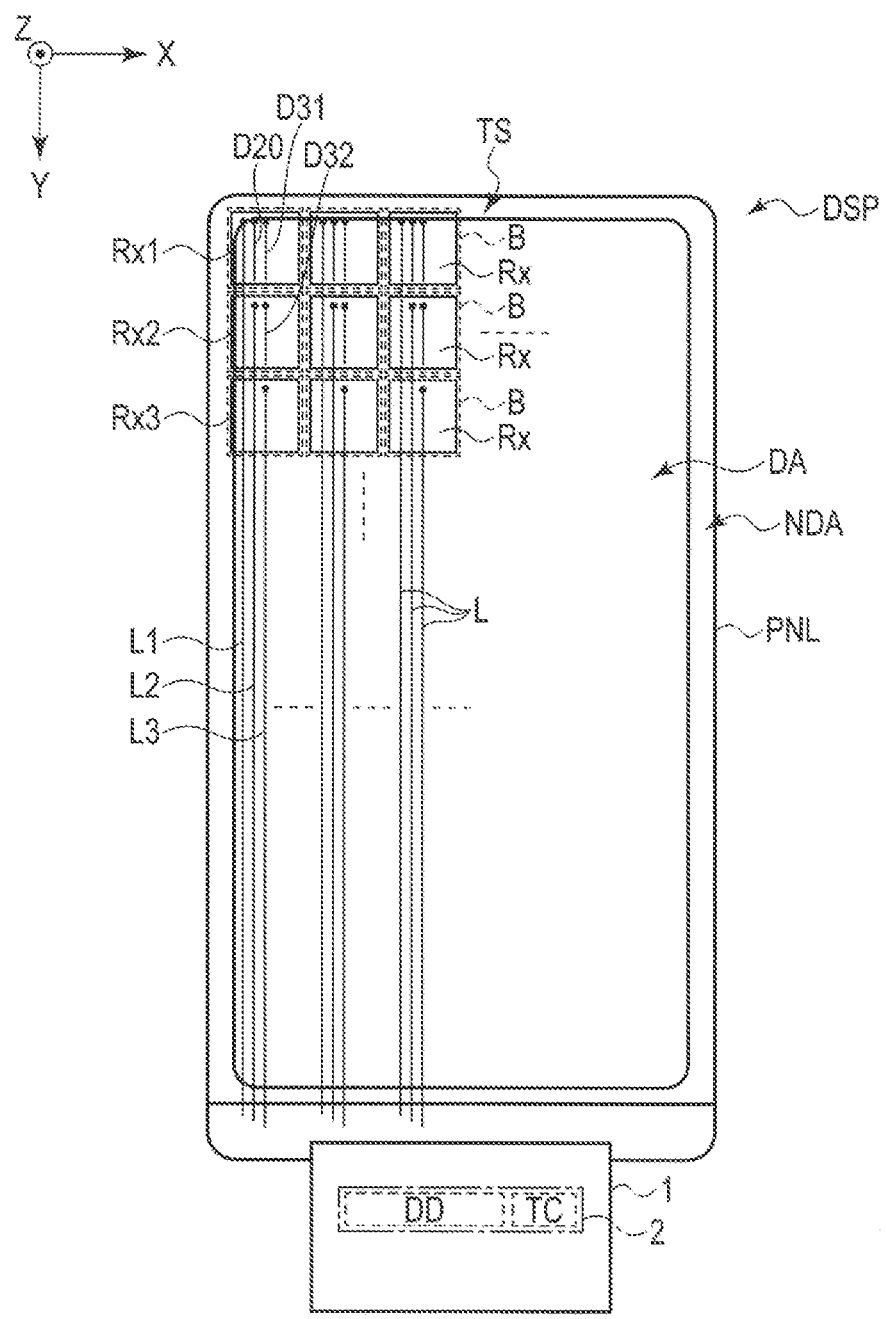
FIG. 2 is a plan view showing a configuration example of a touch sensor TS.

In general, according to one embodiment, a display device includes: a switching element including a drain electrode; a first insulating film including a first through-hole penetrated to the drain electrode, and being formed of an organic insulating material; a first connection electrode which is in contact with the drain electrode at the first through-hole, and is formed of a metal material; a second insulating film which is located on the first insulating film, is formed of an organic insulating material, and includes a second through-hole penetrated to the first connection electrode; and a pixel electrode electrically connected to the first connection electrode.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the present application. Further, in the specification and drawings, structural elements which function in the same or a similar manner to those described in connection with preceding drawings are denoted by like reference numbers, and redundant detailed description thereof is omitted unless necessary.

In the present embodiment, a liquid crystal display device is explained as an example of a display device DSP. Note that the main structures disclosed in the present embodiment are applicable to display devices such as a self-luminous display device with organic electroluminescent display elements and the like, an electronic paper-type display device with electrophoretic elements and the like, a display device employing micro-electromechanical systems (MEMS), and a display device employing electrochromism.

FIG. 1 is a plan view showing an appearance of the display device DSP of the present embodiment. In one example, while a first direction X, a second direction Y, and a third direction Z are orthogonal to one another, they may cross one another at an angle other than ninety degrees. The first direction X and the second direction Y correspond to directions parallel to a substrate main surface which constitutes the display device DSP, and the third direction Z corresponds to a thickness direction of the display device DSP. In the present specification, a direction toward a pointing end of an arrow indicating the third direction Z is referred to as upward (or merely above), and a direction toward the opposite side from the pointing end of the arrow is referred to as downward (or merely below). Further, it is assumed that an observation position at which the display device DSP is to be observed is at the pointing end side of the arrow indicating the third direction Z, and a view toward an X-Y plane defined by the first direction X and the second direction Y from this observation position is called a planar view.

Here, a plan view of the display device DSP in the X-Y plane is illustrated. The display device DSP comprises a display panel PNL, a flexible printed circuit 1, an IC chip 2, and a circuit board 3.

The display panel PNL is a liquid crystal display panel, and includes a first substrate SUB1, a second substrate SUB2, a liquid crystal layer LC not shown in FIG. 1, but will be described later, a sealant SE, a light-shielding layer LS, and spacers SP1 to SP4. The display panel PNL includes a display portion DA in which an image is displayed, and a frame-shaped non-display portion NDA surrounding the display portion DA. The second substrate SUB2 is opposed to the first substrate SUB1. The first substrate SUB1 includes a mounting portion MA which is more extended in the second direction Y than the second substrate SUB2.

The sealant SE is located in the non-display portion NDA, bonds the first substrate SUB1 and the second substrate SUB2 to each other, and also seals the liquid crystal layer LC. The light-shielding layer LS is located in the non-display portion NDA. The sealant SE is provided at a position overlapping the light-shielding layer LS as seen in plan view. In FIG. 1, an area where the sealant SE is arranged and an area where the light-shielding layer LS are arranged are shown by different oblique lines, and an area where the sealant SE and the light-shielding layer LS overlap one another is shown by cross-hatching. The light-shielding layer LS is provided on the second substrate SUB2.

The spacers SP1 to SP4 are all located in the non-display portion NDA. The spacer SP1 is located in the outermost periphery of the display panel PNL. The spacer SP2 is located closer to the display portion DA than the spacer SP1. The spacers SP1 and SP2 overlap the sealant SE. The spacers SP3 and SP4 are located closer to the display portion DA than the sealant SE. Although the spacers SP1 to SP4 are provided on the second substrate SUB2, for example, they may be provided on the first substrate SUB1.

The display portion DA is located at an inner side surrounded by the light-shielding layer LS. The display portion DA comprises a plurality of pixels PX arrayed in a matrix in the first direction X and the second direction Y. The display portion DA includes a pair of sides E1 and E2 extending along the first direction X, a pair of sides E3 and E4 extending along the second direction Y, and four round portions R1 to R4. The display panel PNL includes a pair of sides E11 and E12 extending along the first direction X, a pair of sides E13 and E14 extending along the second direction Y, and four round portions R11 to R14. The round portions R11 to R14 are located outside the round portions R1 to R4, respectively. The radius of curvature of the round portion R11 may be the same as or different from the radius of curvature of the round portion R1.

The flexible printed circuit 1 is mounted on the mounting portion MA, and is connected to the circuit board 3. The IC chip 2 is mounted on the flexible printed circuit 1. Alternatively, the IC chip 2 may be mounted on the mounting portion MA. In the IC chip 2, a display driver DD which outputs a signal necessary for image display in a display mode of displaying an image is incorporated. Also, in the example illustrated, a touch controller TC, which controls a touch sensing mode of detecting approach or contact of an object to the display device DSP, is incorporated in the IC chip 2. In the drawing, the IC chip 2 is shown by a one-dot chain line, and the display driver DD and the touch controller TC are shown by a dotted line.

The display panel PNL of the present embodiment may be a transmissive display panel having a transmissive display function of displaying an image by selectively transmitting light from a rear surface of the first substrate SUB1, a reflective display panel having a reflective display function of displaying an image by selectively reflecting light from a front surface of the second substrate SUB2, or a transflective display panel having the transmissive display function and the reflective display function.

Further, the details of the configuration of the display panel PNL are not explained here, but the display panel PNL may have a configuration corresponding to any one of a display mode using a lateral electric field produced along the substrate main surface, a display mode using a longitudinal electric field produced along the normal of the substrate main surface, a display mode using an inclined electric field which is tilted obliquely with respect to the substrate main surface, and a display mode using an appropriate combination of the above lateral electric field, longitudinal electric field, and inclined electric field. The substrate main surface in the above is a surface parallel to the X-Y plane defined by the first direction X and the second direction Y.

FIG. 2 is a plan view showing a configuration example of a touch sensor TS. Although a self-capacitive touch sensor TS will be explained in the following, the touch sensor TS may be a mutual-capacitive sensor. The touch sensor TS comprises sensor electrodes Rx (Rx1, Rx2, etc.), and sensor lines L (L1, L2, etc.). The sensor electrodes Rx are located in the display portion DA, and arrayed in a matrix in the first direction X and the second direction Y. A single sensor electrode Rx constitutes a single sensor block B. The sensor block B is the minimum unit capable of performing the touch sensing. The sensor lines L extend in the second direction Y, and are arranged in the first direction X in the display portion DA. Each of the sensor lines L is provided at a position overlapping a signal line S to be described later, for example. Further, each of the sensor lines L is drawn to the non-display portion NDA, and is electrically connected to the IC chip 2 via the flexible printed circuit 1.

Here, the relationship between the sensor lines L1 to L3 arranged in the first direction X and the sensor electrodes Rx1 to Rx3 arranged in the second direction Y is noted. The sensor line L1 overlaps the sensor electrodes Rx1 to Rx3, and is electrically connected to the sensor electrode Rx1.

The sensor line L2 overlaps the sensor electrodes Rx2 and Rx3, and is electrically connected to the sensor electrode Rx2. A dummy line D20 is away from the sensor line L2. The dummy line D20 overlaps the sensor electrode Rx1, and is electrically connected to the sensor electrode Rx1. The sensor line L2 and the dummy line D20 are located on the same signal line.

The sensor line L3 overlaps the sensor electrode Rx3, and is electrically connected to the sensor electrode Rx3. A dummy line D31 overlaps the sensor electrode Rx1, and is electrically connected to the sensor electrode Rx1. A dummy line D32 is away from the dummy line D31 and the sensor line L3. The dummy line D32 overlaps the sensor electrode Rx2, and is electrically connected to the sensor electrode Rx2. The sensor line L3, and the dummy lines D31 and D32 are located on the same signal line.

In the touch sensing mode, the touch controller TC applies a touch drive voltage to the sensor lines L. Consequently, the touch drive voltage is applied to the sensor electrodes Rx, and sensing by the sensor electrodes Rx is performed. A sensor signal corresponding to a result of sensing by each of the sensor electrodes Rx is output to the touch controller TC via the sensor line L. The touch controller TC or an external host detects presence or absence of approach or contact of an object to the display device DSP, and the position coordinates of the object, on the basis of the sensing signal.

Note that in the display mode, the sensor electrodes Rx function as a common electrode CE to which a common voltage (Vcom) is applied. The common voltage is applied from, for example, a voltage supply unit included in the display driver DD via the sensor lines L.

Figure 3:
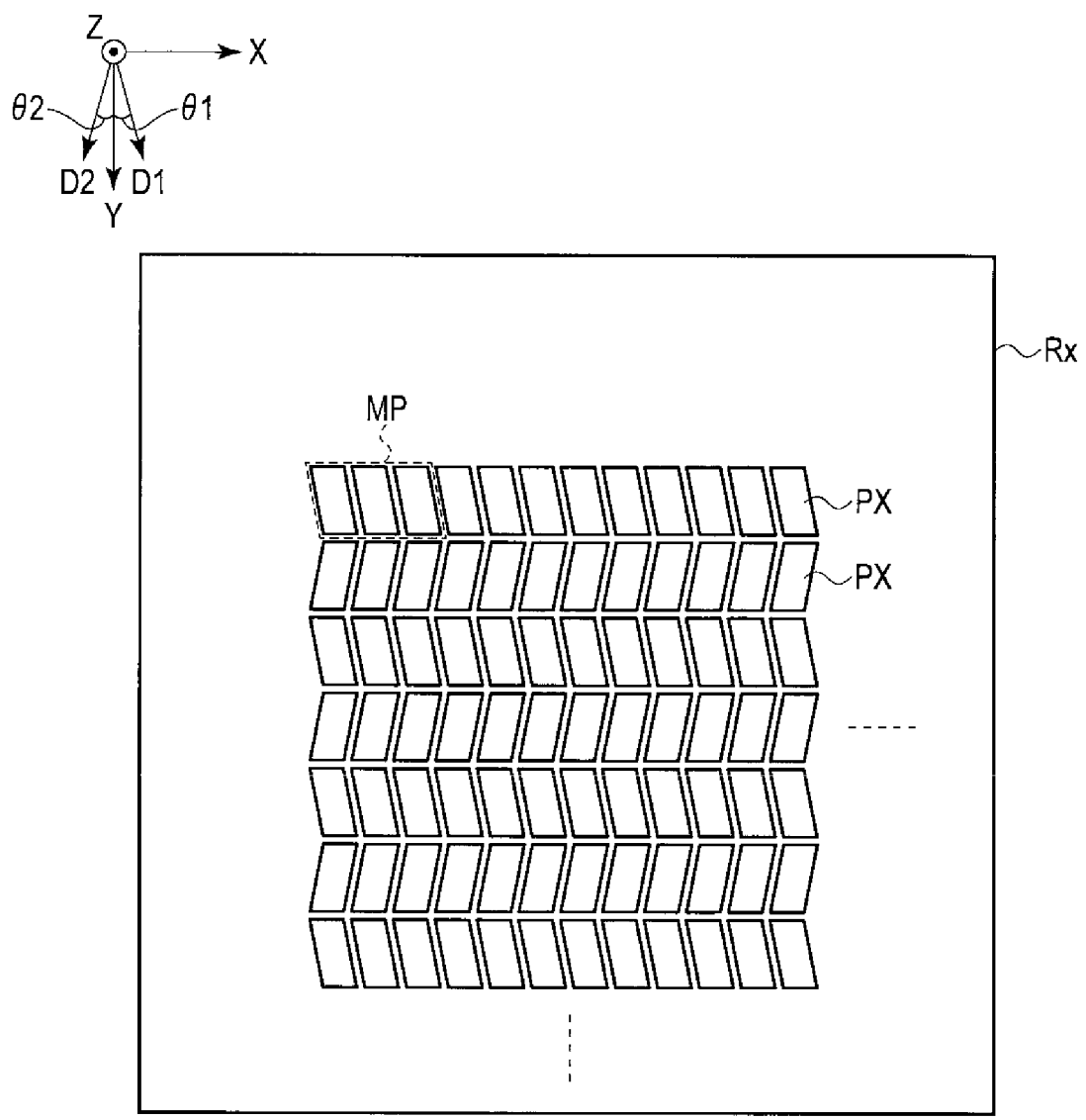
FIG. 3 is a plan view showing a sensor electrode Rx shown in FIG. 2 and a pixel PX.

FIG. 3 is a plan view showing the sensor electrode Rx shown in FIG. 2 and the pixel PX. In FIG. 3, a direction intersecting the second direction Y counterclockwise at an acute angle is defined as direction D1, and a direction intersecting the second direction Y clockwise at an acute angle is defined as direction D2. Note that angle θ1 formed between the second direction Y and direction D1 is substantially the same as angle θ2 formed between the second direction Y and direction D2.

A single sensor electrode Rx is disposed over the pixels PX. In the example illustrated, the pixels PX located in the odd-numbered rows along the second direction Y are extended in direction D1. Also, the pixels PX located in the even-numbered rows along the second direction Y are extended in direction D2. Note that the pixel PX is intended as a minimum unit which can be individually controlled in accordance with a pixel signal, and may be referred to as a sub-pixel. Also, a minimum unit for realizing color display may be referred to as a main pixel MP. The main pixel MP is composed of sub-pixels PX displaying colors different from each other. In one example, the main pixel MP comprises a red pixel which displays red, a green pixel which displays green, and a blue pixel which displays blue as the sub-pixels PX. Further, the main pixel MP may comprise a white pixel which displays white.

For example, in a single sensor electrode Rx, sixty to seventy main pixels MP are disposed along the first direction X, and sixty to seventy main pixels MP are disposed along the second direction Y.

Figure 4:
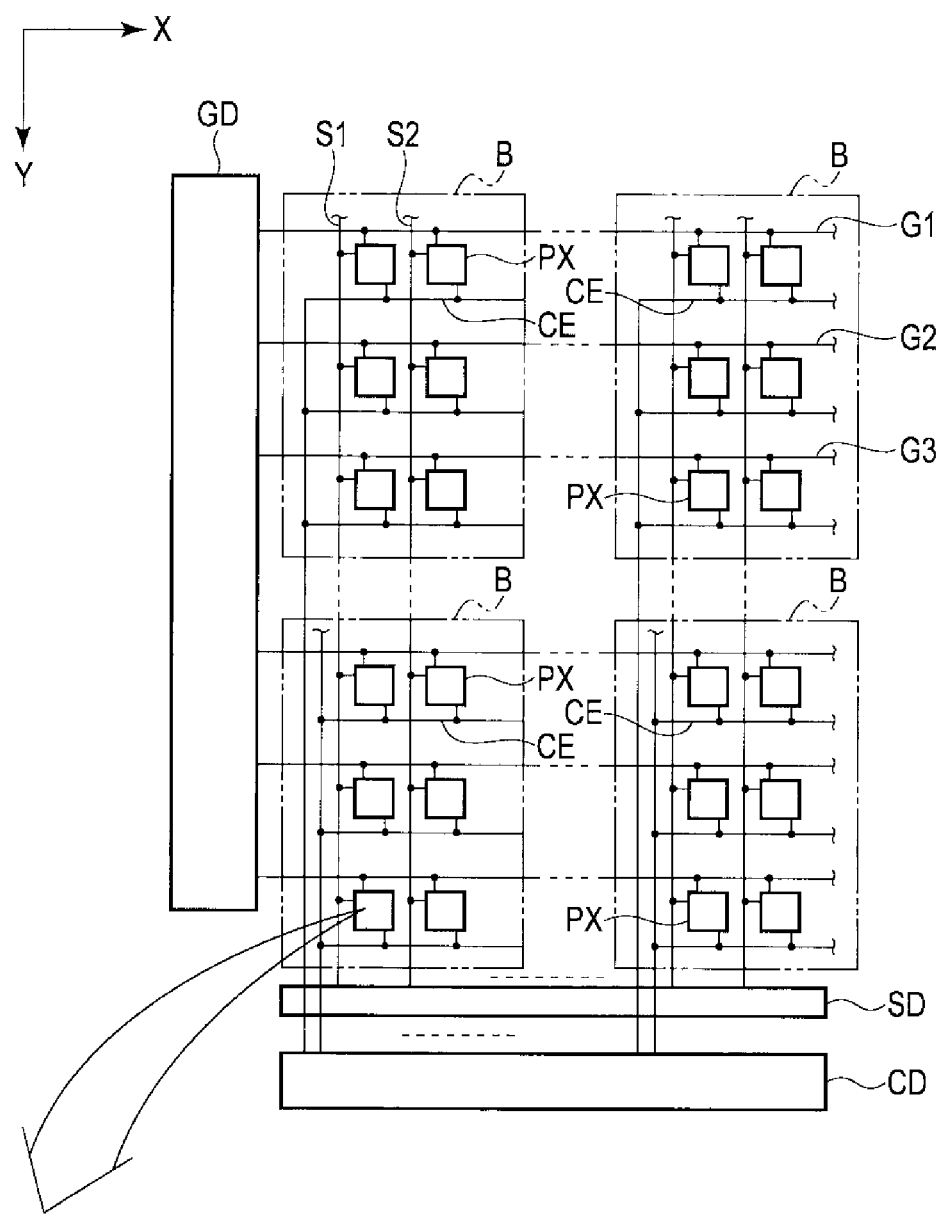
FIG. 4 is an illustration showing a basic structure and an equivalent circuit of the pixel PX.
Figure 4:
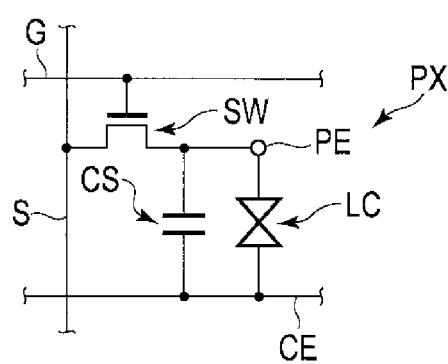

FIG. 4 is an illustration showing a basic structure and an equivalent circuit of the pixel PX. Scanning lines G1, G2, etc., are connected to a scanning line drive circuit GD. Signal lines S1, S2, etc., are connected to a signal line drive circuit SD. Note that the scanning lines G and the signal lines S do not need to extend linearly but may be partially bent. For example, even if a part of the signal line S is bent, it is assumed that the signal line S is extended in the second direction Y.

The common electrode CE is provided for each of sensor blocks B. The common electrode CE is connected to a voltage supply unit CD which supplies a common voltage (Vcom), and is disposed over the pixels PX. Also, each of the common electrodes CE is connected to the touch controller TC as described above, and functions as the sensor electrode Rx.

Each of the pixels PX comprises a switching element SW, a pixel electrode PE, the common electrode CE, the liquid crystal layer LC, and the like. The switching element SW is constituted by a thin-film transistor (TFT), for example, and is electrically connected to the scanning line G and the signal line S. The scanning line G is connected to the switching elements SW of the respective pixels PX arranged in the first direction X. The signal line S is connected to the switching elements SW of the respective pixels PX arranged in the second direction Y. The pixel electrode PE is electrically connected to the switching element SW. Each pixel electrode PE is opposed to the common electrode CE, and drives the liquid crystal layer LC by an electric field produced between the pixel electrode PE and the common electrode CE. A storage capacitance CS is formed between, for example, an electrode having the same potential as that of the common electrode CE and an electrode having the same potential as that of the pixel electrode PE.

Figure 5:
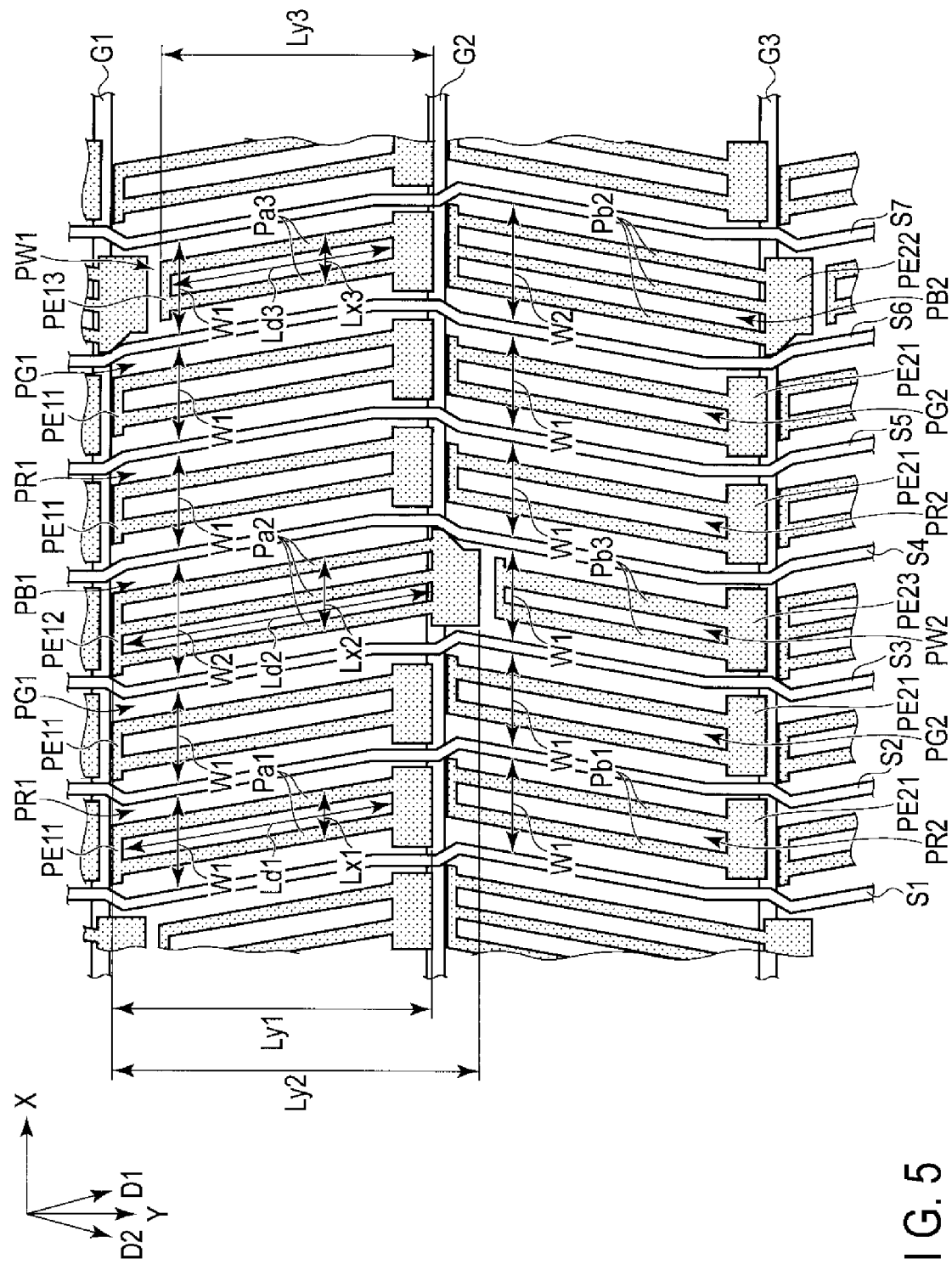
FIG. 5 is a plan view showing an example of a pixel layout.

FIG. 5 is a plan view showing an example of a pixel layout. The scanning lines G1 to G3 extend linearly along the first direction X, and are arranged to be spaced apart from each other in the second direction Y. The signal lines S1 to S7 extend substantially along the second direction Y, and are arranged to be spaced apart from each other in the first direction X.

Red pixel PR1, green pixel PG1, blue pixel PB1, red pixel PR1, green pixel PG1, and white pixel PW1 are arranged in this order along the first direction X between the scanning lines G1 and G2.

The signal lines S1 to S3 are arranged at even intervals W1, and the signal lines S4 to S7 are arranged at even intervals W1 between the scanning lines G1 and G2, and an interval W2 between the signal lines S3 and S4 is greater than the interval W1. Blue pixel PB1 is located between the signal lines S3 and S4. Note that each of the intervals W1 and W2 is a length along the first direction X.

Pixel electrodes PE11 having the same shape are disposed in red pixel PR1 and green pixel PG1, respectively, a pixel electrode PE12 larger than the pixel electrode PE11 is arranged in blue pixel PB1, and a pixel electrode PE13 smaller than the pixel electrode PE11 is arranged in white pixel PW1. As regards a length Lx along the first direction X, the pixel electrodes PE11 and PE13 have the same length Lx1, and the pixel electrode PE12 has a length Lx2 greater than the length Lx1. As regards a length Ly along the second direction Y, the pixel electrode PE11 has a length Ly1, the pixel electrode PE12 has a length Ly2 greater than the length Ly1, and the pixel electrode PE13 has a length Ly3 less than the length Ly1. The pixel electrodes PE11 and PE13 are located between the scanning lines G1 and G2. The pixel electrode PE12 is located between the scanning lines G1 and G2, and also crosses the scanning line G2.

The pixel electrodes PE11 to PE13 include strip electrodes Pa1 to Pa3 extending along direction D1, respectively. In the example illustrated, the number of strip electrodes Pa1 is two, the number of strip electrodes Pa2 is three, and the number of strip electrodes Pa3 is two. The strip electrodes Pa1 to Pa3 are located between the scanning lines G1 and G2. As regards a length Ld along the direction D1, the strip electrode Pa1 has a length Ld1, the strip electrode Pa2 has a length Ld2 greater than the length Ld1, and the strip electrode Pa3 has a length Ld3 less than the length Ld1.

Red pixel PR2, green pixel PG2, white pixel PW2, red pixel PR2, green pixel PG2, and blue pixel PB2 are arranged in this order along the first direction X between the scanning lines G2 and G3. The following respective pairs of pixels, i.e., red pixels PR1 and PR2, green pixels PG1 and PG2, blue pixel PB1 and white pixel PW2, and white pixel PW1 and blue pixel PB2, are arranged in the second direction Y.

The signal lines S1 to S6 are arranged at even intervals W1 between the scanning lines G2 and G3, and interval W2 between the signal lines S6 and S7 is greater than interval W1. Blue pixel PB2 is located between the signal lines S6 and S7.

Pixel electrodes PE21 having the same shape are disposed in red pixel PR2 and green pixel PG2, respectively, a pixel electrode PE22 larger than the pixel electrode PE21 is arranged in blue pixel PB2, and a pixel electrode PE23 smaller than the pixel electrode PE21 is arranged in white pixel PW2, though not described in detail. The pixel electrodes PE21 to PE23 include strip electrodes Pb1 to Pb3 extending along direction D2, respectively. The pixel electrodes PE21 to PE23 have shapes similar to the shapes of the pixel electrodes PE11 to PE13, respectively.

Figure 6:
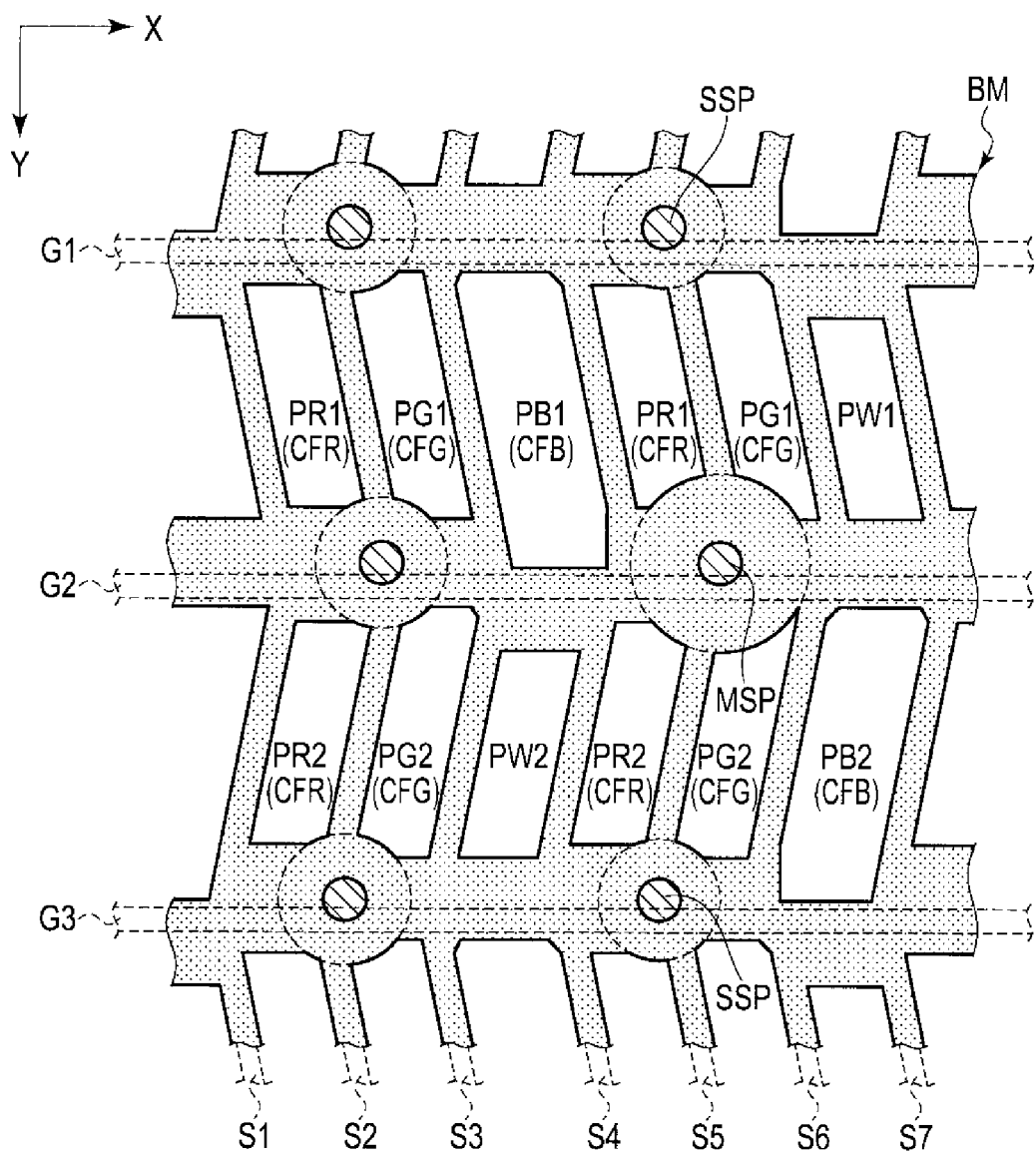
FIG. 6 is a plan view showing a light-shielding layer BM corresponding to the pixel layout shown in FIG. 5.

FIG. 6 is a plan view showing a light-shielding layer BM corresponding to the pixel layout shown in FIG. 5. The light-shielding layer BM is formed in a lattice shape, and in planar view, overlaps each of the scanning lines G1 to G3 and the signal lines S1 to S7. The light-shielding layer BM surrounds each of the red pixels PR1 and PR2, the green pixels PG1 and PG2, the blue pixels PB1 and PB2, and the white pixels PW1 and PW2.

The signal line S5 is located between the red pixel PR1 and the green pixel PG1, and between the red pixel PR2 and the green pixel PG2. A main spacer MSP and a sub-spacer SSP both overlap the signal line S5. The main spacer MSP forms a cell gap between the first substrate SUB1 and the second substrate SUB2, and the sub-spacer SSP has a height less than the height of the main spacer MSP.

The light-shielding layer BM is expanded substantially concentrically with the sub-spacer SSP in the periphery of the sub-spacer SSP. Also in the periphery of the main spacer MSP, the light-shielding layer BM is expanded substantially concentrically with the main spacer MSP.

A red color filter CFR is arranged in the red pixels PR1 and PR2, a green color filter CFG is arranged in the green pixels PG1 and PG2, and a blue color filter CFB is arranged in the blue pixels PB1 and PB2.

FIG. 7 is a plan view showing an example of a pixel shown in FIG. 5. Here, the green pixel PG1, which is surrounded by the scanning lines G1 and G2 and the signal lines S5 and S6, shown in FIG. 5 is noted, and the main portion is explained.

The switching element SW is electrically connected to the scanning line G2 and the signal line S6. The switching element SW of the illustrated example has a double-gate structure. The switching element SW includes a semiconductor layer SC, and a drain electrode DE. Note that in the switching element SW, the drain electrode DE may be referred to as a source electrode. The semiconductor layer SC is disposed such that a part of the semiconductor layer SC overlaps the signal line S6, and the other part is extended between the signal lines S5 and S6 to form a substantially U-shaped configuration. The semiconductor layer SC crosses the scanning line G2 in an area overlapping the signal line S6, and at a portion between the signal lines S5 and S6. In the scanning line G2, areas overlapping the semiconductor layer SC serve as gate electrodes GE1 and GE2, respectively. The semiconductor layer SC is electrically connected to the signal line S6 through a contact hole CH1 at an end portion SCA of the semiconductor layer SC, and is electrically connected to the drain electrode DE through a contact hole CH2 at the other end portion SCB of the semiconductor layer SC. The drain electrode DE is formed in an island shape, and is disposed between the signal lines S5 and S6.

The pixel electrode PE11 includes a base portion BS which is integral with the strip electrodes Pa1. The base portion BS overlaps the drain electrode DE. The base portion BS is electrically connected to the drain electrode DE. A connection portion connecting the pixel electrode PE11 and the switching element SW will be described later.

Figure 8:
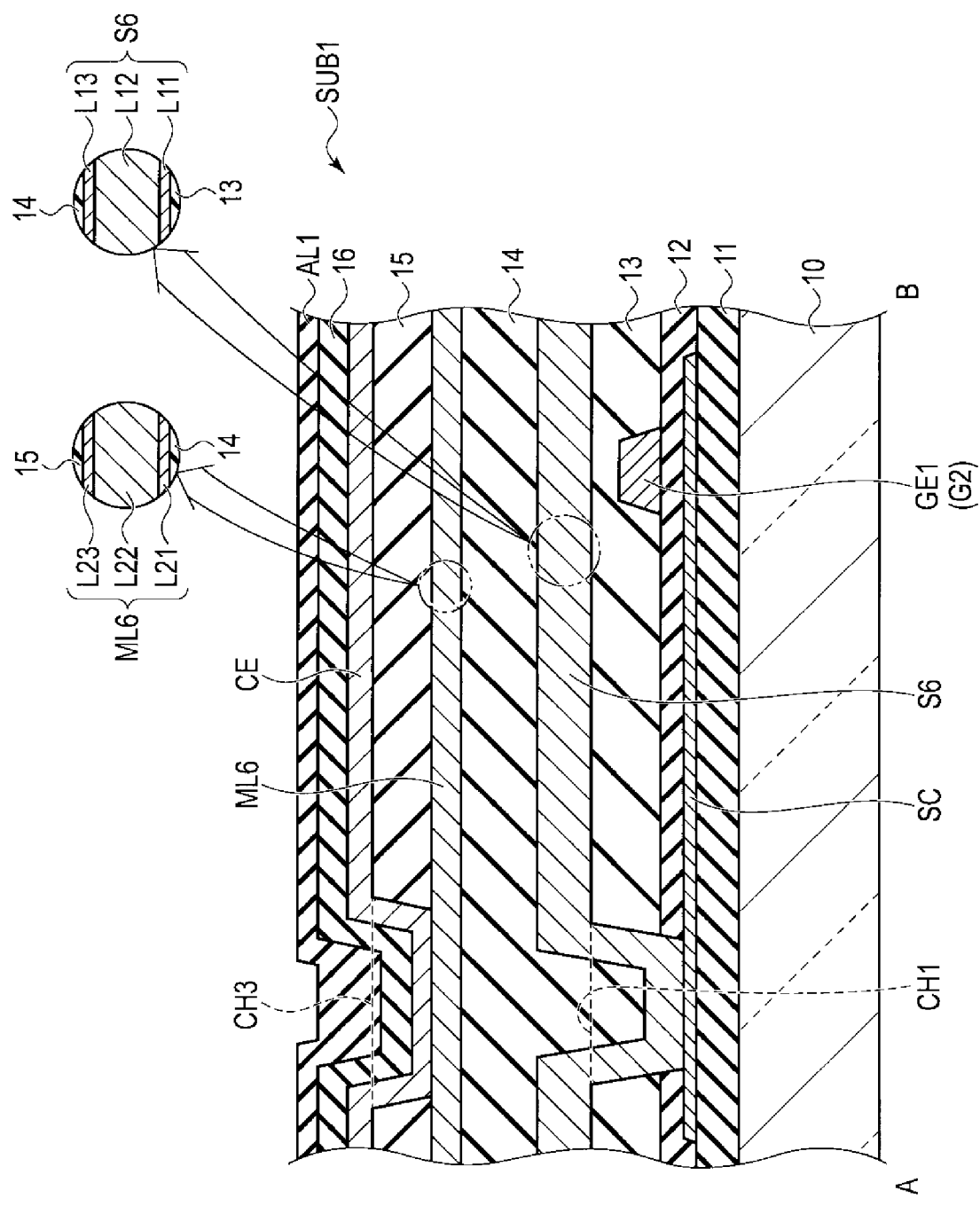
FIG. 8 is a cross-sectional view of a first substrate SUB1 taken along line A-B shown in FIG. 7.

FIG. 8 is a cross-sectional view of the first substrate SUB1 taken along line A-B shown in FIG. 7.

The first substrate SUB1 includes an insulating substrate 10, insulating films 11 to 16, the semiconductor layer SC, the scanning line G2, the signal line S6, a metal line ML6, the common electrode CE, an alignment film AL1, and the like.

The insulating substrate 10 is a light transmissive substrate such as a glass substrate or a resin substrate having flexibility. The insulating film 11 is located on the insulating substrate 10. The semiconductor layer SC is located on the insulating film 11, and is covered with the insulating film 12. The semiconductor layer SC is formed of, for example, polycrystalline silicon, but may be formed of amorphous silicon or an oxide semiconductor.

The gate electrode GE1, which is a part of the scanning line G2, is disposed on the insulating film 12, and is covered with the insulating film 13. Note that the other scanning lines, which are not illustrated, are also located in the same layer as the scanning line G2. The scanning line G2 is formed of a metal material such as aluminum (Al), titanium (Ti), silver (Ag), molybdenum (Mo), tungsten (W), copper (Cu), or chromium (Cr), or an alloy obtained by combining the aforementioned metal materials, and may have a single-layer structure or a multilayer structure. In one example, the scanning line G2 is formed of molybdenum tungsten alloy.

The signal line S6 is located on the insulating film 13, and is covered with the insulating film 14. Note that the other signal lines, which are not illustrated, are also located in the same layer as the signal line S6. The signal line S6 is formed of, for example, a metal material as described above or an alloy formed of a combination of the above metal materials, and may have a single-layer structure or a multilayer structure. In one example, the signal line S6 is a stacked layer body constituted of a first layer L11 containing titanium (Ti), a second layer L12 containing aluminum (Al), and a third layer L13 containing titanium (Ti) stacked in this order. The signal line S6 is in contact with the semiconductor layer SC through the contact hole CH1 which penetrates the second insulating film 12 and the third insulating film 13.

The metal line ML6 is located on the insulating film 14, and is covered with the insulating film 15. The metal line ML6 is formed of, for example, a metal material as described above or an alloy formed of a combination of the above metal materials, and may have a single-layer structure or a multilayer structure. For example, the metal line ML6 is either a stacked layer body constituted of a fourth layer L21 containing titanium (Ti), a fifth layer L22 containing aluminum (Al), and a sixth layer L23 containing titanium (Ti) stacked in this order, or a stacked layer body constituted of the fourth layer L21 containing molybdenum (Mo), the fifth layer L22 containing aluminum (Al), and the sixth layer L23 containing molybdenum (Mo) stacked in this order.

The common electrode CE is located on the insulating film 15, and is covered with the insulating film 16. The common electrode CE is a transparent electrode formed of a transparent conductive material such as indium tin oxide (ITO) or indium zinc oxide (IZO). The common electrode CE is in contact with the metal line ML6 through a contact hole CH3 penetrating the insulating film 15. The alignment film AL1 is located on the insulating film 16. In the example illustrated, the contact hole CH3 is located directly above the contact hole CH1.

Each of the insulating films 11 to 13, and the insulating film 16 is an inorganic insulating film formed of an inorganic insulating material such as silicon oxide, silicon nitride, or silicon oxynitride, and may have a single-layer structure or a multilayer structure. Each of the insulating films 14 and 15 is an organic insulating film formed of an organic insulating material such as acrylic resin. Note that the insulating film 15 may be an inorganic insulating film.

As described above, the common electrode CE also functions as the sensor electrode Rx, and the metal line ML6 also functions as the sensor line L which is electrically connected to the sensor electrode Rx.

Figure 9:
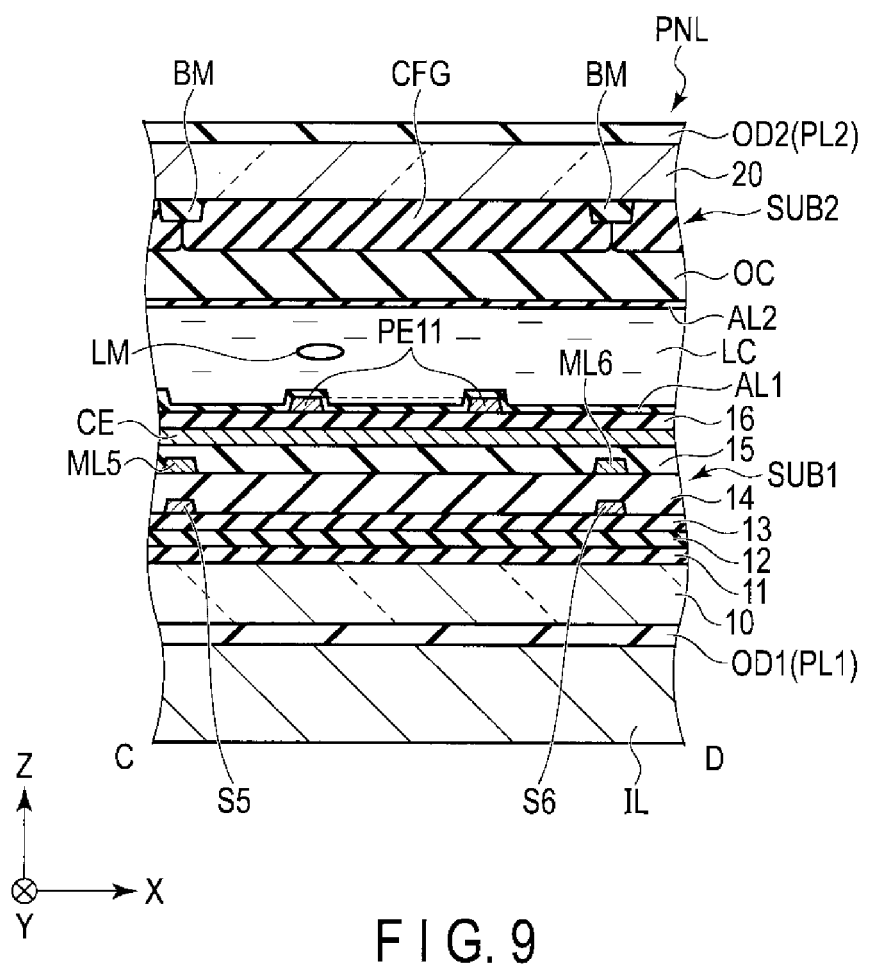
FIG. 9 is a cross-sectional view of a display panel PNL taken along line C-D of FIG. 7.

FIG. 9 is a cross-sectional view of the display panel PNL taken along line C-D shown in FIG. 7. The illustrated example corresponds to a case where a fringe field switching (FFS) mode, which is one of display modes using a lateral electric field, is applied.

In the first substrate SUB1, the signal lines S5 and S6 are located on the insulating film 13, and are covered with the insulating film 14. Metal lines ML5 and ML6 are located directly above the signal lines S5 and S6, respectively. The pixel electrode PE11 is located on the insulating film 16, and is covered with the alignment film AL1. The pixel electrode PE11 is a transparent electrode formed of a transparent conductive material such as ITO or IZO.

The second substrate SUB2 comprises an insulating substrate 20, the light-shielding layer BM, the color filter CFG, an overcoat layer OC, an alignment film AL2, etc.

The insulating substrate 20 is a light transmissive substrate such as a glass substrate or a resin substrate similarly to the insulating substrate 10. The light-shielding layer BM and the color filter CFG are located on a side of the second insulating substrate 20, which is opposed to the first substrate SUB1. The color filter CFG is arranged at a position opposed to the pixel electrode PE11, and a part of the color filter CFG overlaps the light-shielding layer BM. The overcoat layer OC covers the color filter CFG. The overcoat layer OC is formed of a transparent resin. Similarly to the color filter CFG, the other color filters CFR and CFB are also arranged at positions corresponding to the pixel electrodes PE, respectively, and are covered with the overcoat layer OC. The alignment film AL2 covers the overcoat layer OC. The alignment film AL1 and the alignment film AL2 are formed of, for example, a material exhibiting horizontal alignment properties.

The first substrate SUB1 and the second substrate SUB2 described above are arranged such that the alignment film AL1 and the alignment film AL2 are opposed to each other. Each of the above main spacer MSP and the sub-spacer SSP is formed of a resin material, and is arranged between the first substrate SUB1 and the second substrate SUB2, though not illustrated in the drawing. The main spacer MSP forms a predetermined cell gap between the alignment film AL1 and the alignment film AL2. The cell gap is, for example, 2 to 5 µm. The first substrate SUB1 and the second substrate SUB2 are bonded to each other by a sealant with a predetermined cell gap formed between the substrates.

The liquid crystal layer LC is located between the first substrate SUB1 and the second substrate SUB2, and is held between the alignment film AL1 and the alignment film AL2. The liquid crystal layer LC includes liquid crystal molecules LM. The liquid crystal layer LC is composed of a liquid crystal material of a positive type (positive dielectric anisotropy) or a negative type (negative dielectric anisotropy).

An optical element OD1 including a polarizer PL1 is bonded to the insulating substrate 10. An optical element OD2 including a polarizer PL2 is bonded to the insulating substrate 20. Note that each of the optical element OD1 and the optical element OD2 may comprise a retardation film, a scattering layer, an antireflective layer, and the like, as needed.

In the display panel PNL as described above, in an off-state in which no electric field is produced between the pixel electrode PE and the common electrode CE, the liquid crystal molecules LM are initially aligned in a predetermined direction between the alignment film AL1 and the alignment film AL2. In such an off-state, light emitted from an illumination device IL to the display panel PNL is absorbed by the optical element OD1 and the optical element OD2, so that dark display is exhibited. Meanwhile, in an on-state in which an electric field is produced between the pixel electrode PE and the common electrode CE, the liquid crystal molecules LM are aligned in a direction different from the initial alignment direction by the electric field, and this alignment direction is controlled by the electric field. In such an on-state, part of light from the illumination device IL is transmitted through the optical element OD1 and the optical element OD2, so that bright display is exhibited.

Figure 10:
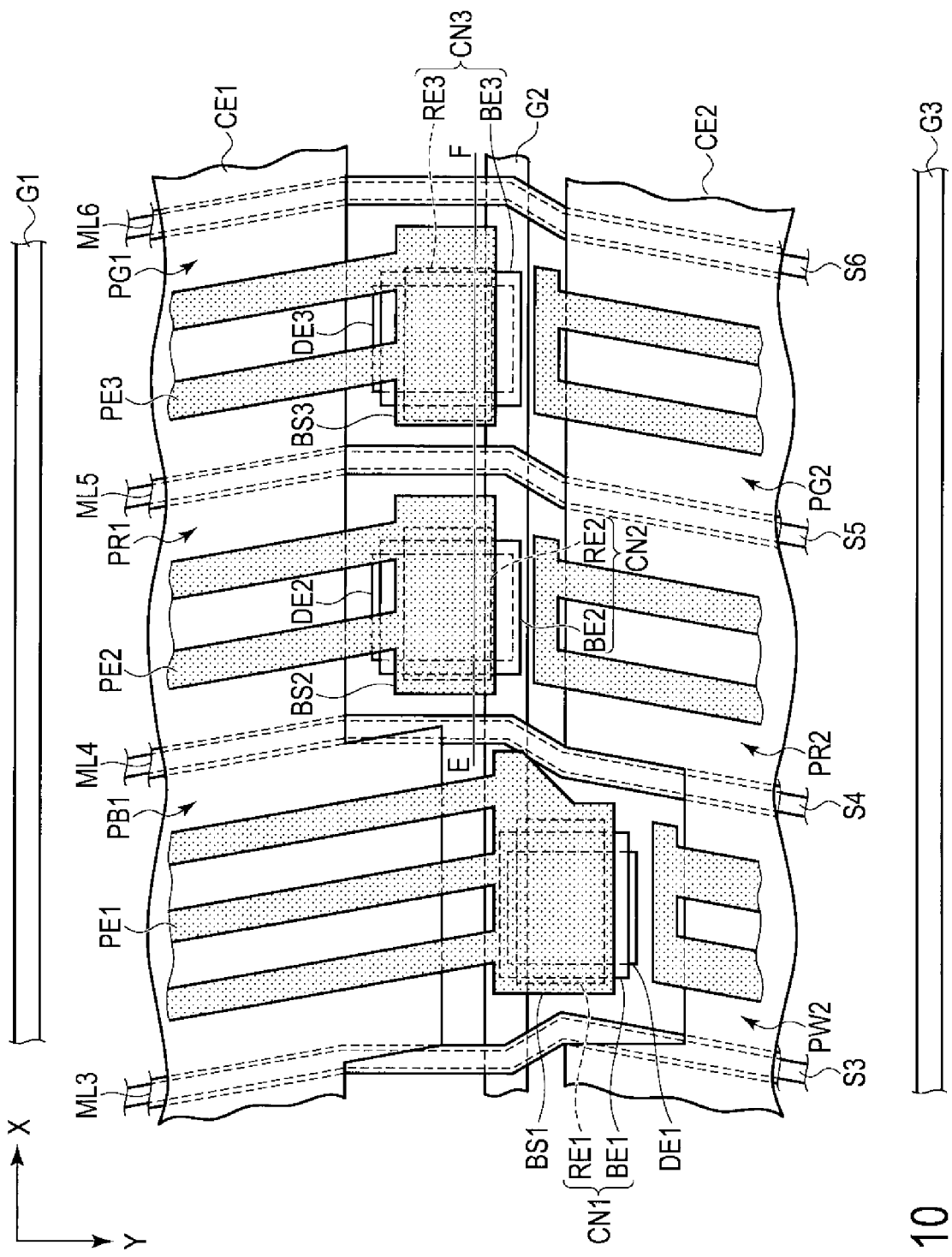
FIG. 10 is plan view showing an example of three pixels PB1, PR1, and PG1 arranged in a first direction X.

FIG. 10 is a plan view showing an example of three pixels, i.e., the blue pixel PB1, the red pixel PR1, and the green pixel PG1, arranged in the first direction X. In this explanation, a reference number assigned to each of the pixel electrode and the drain electrode disposed in the three pixels, i.e., the blue pixel PB1, the red pixel PR1, and the green pixel PG1, is changed in order to distinguish between the electrodes.

The blue pixel PB1 comprises a pixel electrode PE1, a drain electrode DE1, a first connection electrode BE1, and a second connection electrode RE1. The first connection electrode BE1 and the second connection electrode RE1 overlap a base portion BS1 and the drain electrode DE1, and constitute a connection portion CN1 which electrically connects the pixel electrode PE1 and the drain electrode DE1. The connection portion CN1 is located between the scanning lines G2 and G3.

Similarly to the blue pixel PB1, the red pixel PR1 also comprises a pixel electrode PE2, a drain electrode DE2, and a connection portion CN2, and the connection portion CN2 is constituted of a first connection electrode BE2 and a second connection electrode RE2. Similarly to the blue pixel PB1, the green pixel PG1 also comprises a pixel electrode PE3, a drain electrode DE3, and a connection portion CN3, and the connection portion CN3 is constituted of a first connection electrode BE3 and a second connection electrode RE3. Each of the connection portions CN2 and CN3 is located between the scanning lines G1 and G2.

A common electrode CE1 is disposed over the blue pixel PB1, the red pixel PR1, and the green pixel PG1. The common electrode CE1 protrudes to be close to the scanning line G2 in the blue pixel PB1. A common electrode CE2 is away from the common electrode CE1. The common electrode CE2 is disposed over the white pixel PW2, the red pixel PR2, and the green pixel PG2. The common electrode CE2 is recessed to be away from the scanning line G2 in the white pixel PW2. In the example illustrated, the common electrodes CE1 and CE2 are electrically insulated from each other. Note that the common electrodes CE1 and CE2 may be electrically connected to each other via a bridge portion, as will be described later. The connection portions CN1 to CN3 are located between the common electrodes CE1 and CE2.

Metal lines ML3 to ML6 overlap the signal lines S3 to S6, respectively.

The drain electrodes DE1 to DE3 are located in the same layer as the signal line S3, etc., and are formed of the same material as that of the signal line S3. The first connection electrodes BE1 to BE3 are located in the same layer as the metal line ML3, etc., and are formed of the same material as that of the metal line ML3. The second connection electrodes RE1 to RE3 are located in the same layer as the common electrode CE1, etc., and are formed of the same material as that of the common electrode CE1.

Figure 11:
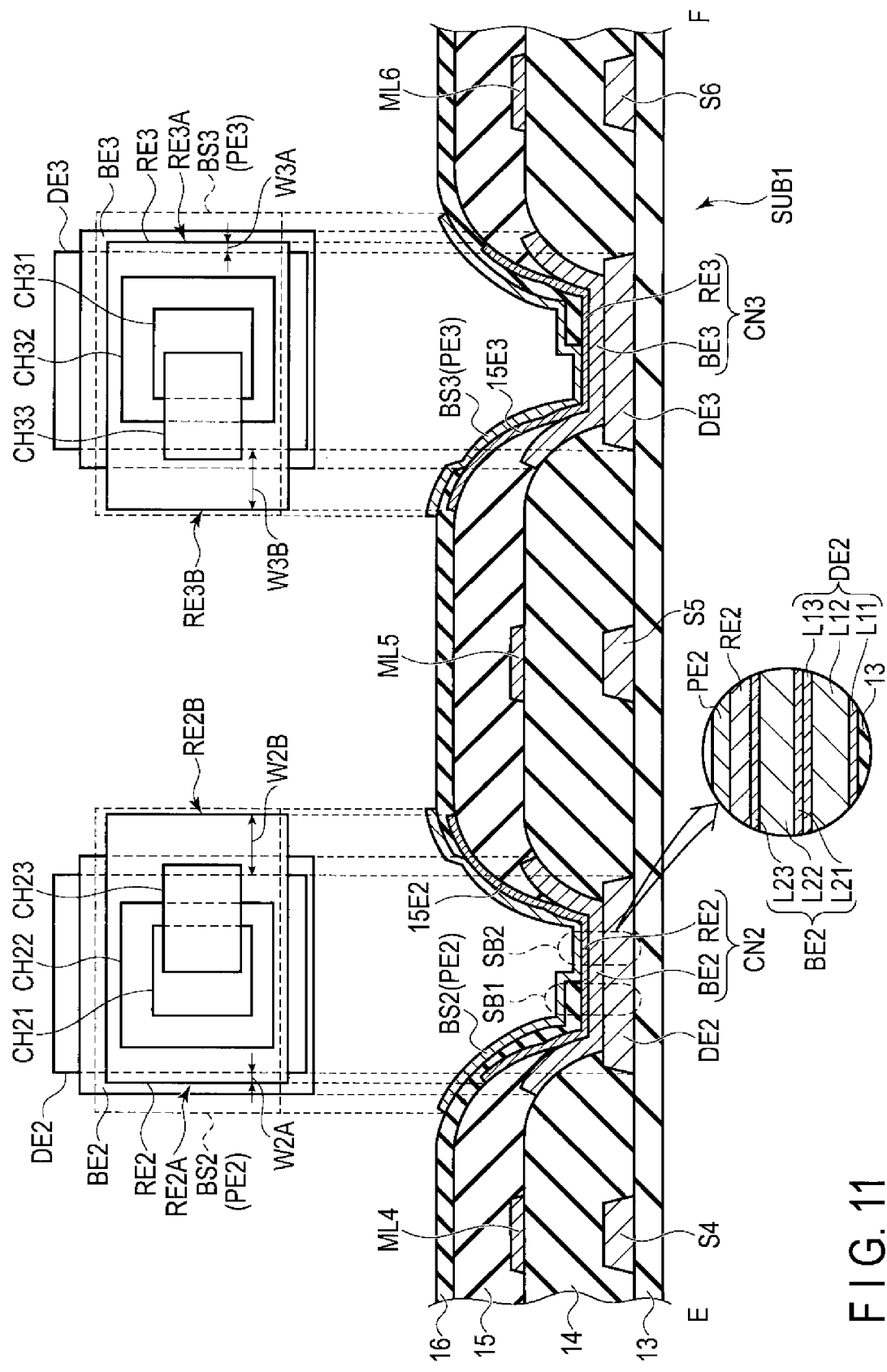
FIG. 11 is a cross-sectional view of the first substrate SUB1 taken along line E-F shown in FIG. 10.

FIG. 11 is a cross-sectional view of the first substrate SUB1 taken along line E-F shown in FIG. 10. In the first substrate SUB1 illustrated, parts below the insulating film 13 and the alignment film AL1 are omitted from the illustration. FIG. 11 also shows a plan view of the main portions of the connection portions CN2 and CN3 corresponding to their cross sections.

The signal lines S4 to S6, and the drain electrodes DE2 and DE3 are located on the insulating film 13, and are covered with the insulating film 14. The drain electrodes DE2 and DE3 are formed of the same material as that of the signal lines S4 to S6. For example, the drain electrode DE2 shown in an enlarged scale in the drawing is a stacked layer body constituted of a first layer L11 containing titanium (Ti), a second layer L12 containing aluminum (Al), and a third layer L13 containing titanium (Ti) stacked in this order similarly to the signal line S6 shown in FIG. 8. The insulating film 14 includes through-holes CH21 and CH31 penetrated to the drain electrodes DE2 and DE3, respectively.

The metal lines ML4 to ML6, and the first connection electrodes BE2 and BE3 are located on the insulating film 14, and are covered with the insulating film 15. The first connection electrode BE2 is in contact with the drain electrode DE2 in the through-hole CH21. Similarly, the first connection electrode BE3 is in contact with the drain electrode DE3 in the through-hole CH31. The first connection electrodes BE2 and BE3 are formed of the same material as that of the metal lines ML4 to ML6. For example, the first connection electrode BE2 shown in an enlarged scale in the drawing is a stacked layer body constituted of a fourth layer L21 in contact with the third layer L13, a fifth layer L22 containing aluminum (Al), and a sixth layer L23 stacked in this order. Both of the fourth layer L21 and the sixth layer L23 are layers containing titanium (Ti), or layers containing molybdenum (Mo). The metal lines ML4 to ML6 are located directly above the signal lines S4 to S6, respectively.

The insulating film 15 includes through-holes CH22 and CH32 penetrated to the first connection electrodes BE2 and BE3, respectively. In planar view, the through-hole CH22 is greater than the through-hole CH21, and the through-hole CH32 is greater than the through-hole CH31.

The second connection electrodes RE2 and RE3 are located on the insulating film 15, and are covered with the insulating film 16. The second connection electrode RE2 is in contact with the first connection electrode BE2 at the though-hole CH22. Similarly, the second connection electrode RE3 is in contact with the first connection electrode BE3 at the though-hole CH32. The second connection electrodes RE2 and RE3 are transparent electrodes which are formed of the same material as that of the common electrodes CE1 and CE2 shown in FIG. 10. For example, the second connection electrode RE2 shown in an enlarged scale in the drawing is in contact with the sixth layer L23.

In the example illustrated, the second connection electrode RE2 is offset toward the right side in the drawing, in other words, the side close to the signal line S5 and the metal line ML5. That is, the second connection electrode RE2 includes an end portion RE2A, and an end portion RE2B on a side opposite to the end portion RE2A. In planar view, the end portions RE2A and RE2B are both located outside the drain electrode DE2. Also, while the end portion RE2A overlaps the first connection electrode BE2, the end portion RE2B is located on an outer side of the first connection electrode BE2. A width W2A between the drain electrode DE2 and the end portion RE2A is less than a width W2B between the drain electrode DE2 and the end portion RE2B.

Similarly, the second connection electrode RE3 is offset toward the left side in the drawing, in other words, the side close to the signal line S5 and the metal line ML5. That is, end portions RE3A and RE3B of the second connection electrode RE3 are both located outside the drain electrode DE3. The end portion RE3B is located on a side opposed to the end portion RE2B. A width W3A between the drain electrode DE3 and the end portion RE3A is less than a width W3B between the drain electrode DE3 and the end portion RE3B.

The insulating film 16 includes through-holes CH23 and CH33 penetrated to the second connection electrodes RE2 and RE3, respectively. In planar view, the through-hole CH23 is offset toward the right side in the drawing, and the through-hole CH33 is offset toward the left side in the drawing.

A base portion BS2 of the pixel electrode PE2 is located on the insulating film 16, and is covered with the alignment film AL1 not shown. The pixel electrode PE2 is in contact with the second connection electrode RE2 in the through-hole CH23. Similarly, the pixel electrode PE3 is in contact with the second connection electrode RE3 in the through-hole CH33. It suffices that the pixel electrodes PE2 and PE3 are electrically connected to the first connection electrodes BE2 and BE3, respectively, and the second connection electrodes RE2 and RE3 may be omitted.

When the through-hole CH21 is focused, stacked layer bodies SB1 and SB2 are arranged. The stacked layer body SB1 is formed by stacking the drain electrode DE2, the first connection electrode BE2, the second connection electrode RE2, the insulating film 16, and the pixel electrode PE2 in this order. The stacked layer body SB2 is formed by stacking the drain electrode DE2, the first connection electrode BE2, the second connection electrode RE2, and the pixel electrode PE2 in this order. In the example illustrated, the stacked layer body SB1 is located on the left side in the drawing, or the side close to the signal line S4 and the metal line ML4, and the stacked layer body SB2 is located on the right side in the drawing, or the side close to the signal line S5 and the metal line ML5.

Between the signal line S5 and the through-hole CH22 or between the metal line ML5 and the through-hole CH22, the insulating film 15 includes an end portion 15E2 that is located between the first connection electrode BE2 and the second connection electrode RE2. The pixel electrode PE2 is in contact with the second connection electrode RE2 directly above the end portion 15E2. Similarly, between the signal line S5 and the through-hole CH32 or between the metal line ML5 and the through-hole CH32, the insulating film 15 includes an end portion 15E3 that is located between the first connection electrode BE3 and the second connection electrode RE3. The pixel electrode PE3 is in contact with the second connection electrode RE3 directly above the end portion 15E3.

In the example shown in FIG. 11, the insulating film 14 corresponds to a first insulating film, the insulating film 15 corresponds to a second insulating film, and the insulating film 16 corresponds to a third insulating film. The through-hole CH21 corresponds to a first through-hole, the through-hole CH22 corresponds to a second through-hole, and the through-hole CH23 corresponds to a third through-hole. In the second connection electrode RE2, the end portion RE2A corresponds to a first end portion, and the end portion RE2B corresponds to a second end portion. The stacked layer body SB1 corresponds to a first stacked layer body, and the stacked layer body SB2 corresponds to a second stacked layer body.

Figure 12:
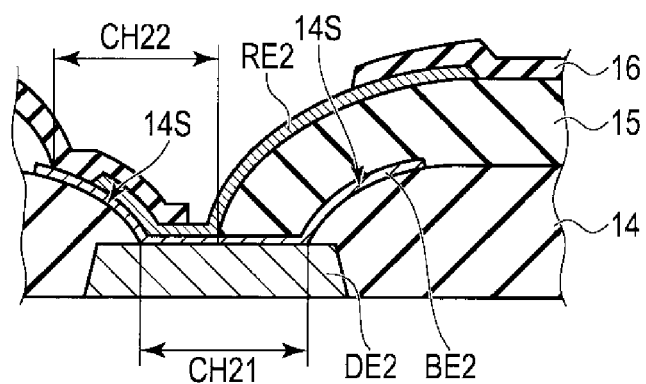
FIG. 12 is a cross-sectional view for explaining one of advantages of the present embodiment.

FIG. 12 is a cross-sectional view for explaining one of advantages of the present embodiment. In the drawing, parts below the drain electrode DE2 and the insulating film 14, and parts above the second connection electrode RE2 and the insulating film 16 are omitted from the illustration.

FIG. 12 corresponds to the present embodiment. According to the present embodiment, the first connection electrode BE2 is interposed between the drain electrode DE2 and the second connection electrode RE2. In other words, the first connection electrode BE2 is in contact with the drain electrode DE2 in the entire area of the drain electrode DE2 that is exposed from the through-hole CH21. The second connection electrode RE2 is in contact with the first connection electrode BE2 in an area of the first connection electrode BE2 that is exposed from the through-hole CH22. Accordingly, even if the through-hole CH22 is misaligned with respect to the through-hole CH21, an area of contact between the drain electrode DE2 and the first connection electrode BE2, and an area of contact between the first connection electrode BE2 and the second connection electrode RE2 are not reduced. Accordingly, it is possible to suppress increase in the contact resistance between the drain electrode DE2 and the second connection electrode RE2. Consequently, degradation in display quality caused by the increase in the contact resistance can be suppressed.

Further, there is no need to enlarge a through-hole in consideration of misalignment or the like of the through-hole, and it is possible to suppress degradation in display quality resulting from enlarge in the through-hole.

Further, while the insulating film 14, which is an organic insulating film, includes an inclined surface 14S which is inclined toward the through-hole CH21, the inclined surface 14S is covered with the first connection electrode BE2 formed of a light-shielding metal material. Accordingly, light leakage at the inclined surface 14S can be suppressed.

Note that the first connection electrode BE2 can be formed of the same material as that used for the sensor line L shown in FIG. 2, or the metal line ML4, etc., shown in FIG. 11, and in the same process. In other word, there is no need to add a separate manufacturing process in adding the first connection electrode BE2.

Figure 13:
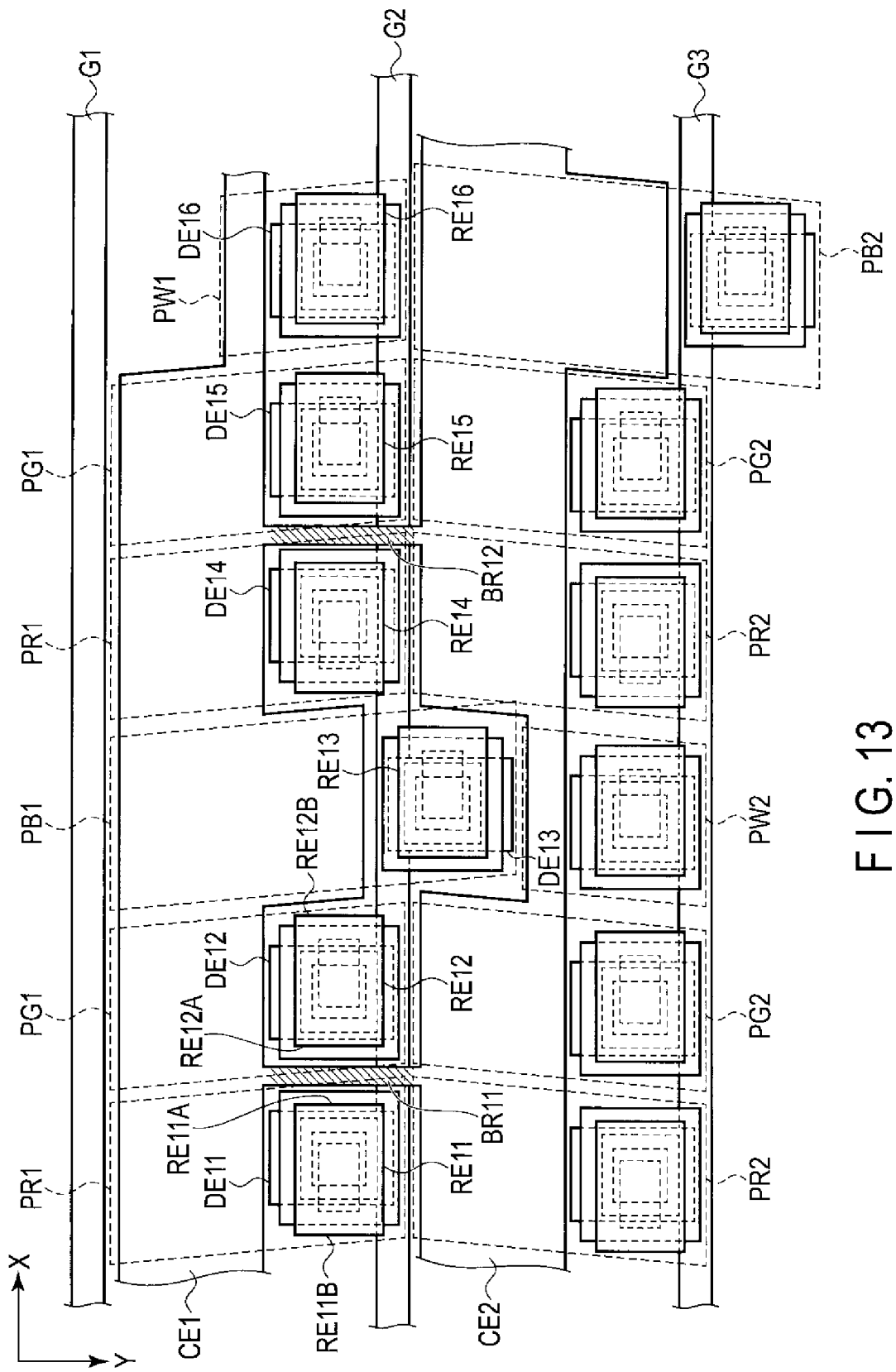
FIG. 13 is a plan view showing an example of a layout of common electrodes CE1 and CE2, and second connection electrodes RE11 to RE16.

FIG. 13 is a plan view showing an example of a layout of the common electrodes CE1 and CE2, and second connection electrodes RE11 to RE16.

The common electrode CE1 is arranged over the red pixel PR1, the green pixel PG1, the blue pixel PB1, and the white pixel PW1, between the scanning lines G1 and G2. The common electrode CE2 is away from the common electrode CE1, and is arranged over the red pixel PR2, the green pixel PG2, the blue pixel PB2, and the white pixel PW2, between the scanning lines G2 and G3. Bridge portions BR11 and BR12 are portions which connect the common electrodes CE1 and CE2, as shown by hatched lines in the drawing, and are formed integrally with the common electrodes CE1 and CE2.

The second connection electrodes RE11 and RE14 correspond to the second connection electrode RE3 shown in FIG. 11, and are shifted to the left side in the drawing relative to drain electrodes DE11 and DE14, respectively. The second connection electrodes RE12, RE13, RE15, and RE16 correspond to the second connection electrode RE2 shown in FIG. 11, and are shifted to the right side in the drawing relative to drain electrodes DE12, DE13, DE15, and DE16, respectively.

When the second connection electrodes RE11 and RE12 are focused, the second connection electrodes RE11 and RE12 are shifted to sides to be away from each other. The bridge portion BR11 is located between the second connection electrodes RE11 and RE12. In other words, the bridge portion BR11 is adjacent to an end portion RE11A of the second connection electrode RE11, and an end portion RE12A of the second connection electrode RE12. The end portion RE11A of the second connection electrode RE11 corresponds to the end portion RE3A of the second connection electrode RE3 shown in FIG. 11, and an end portion RE11B corresponds to the end portion RE3B. Also, the end portion RE12A of the second connection electrode RE12 corresponds to the end portion RE2A of the second connection electrode RE2 shown in FIG. 11, and an end portion RE12B corresponds to the end portion RE2B.

Similarly, when the second connection electrodes RE14 and RE15 are focused, the second connection electrodes RE14 and RE15 are shifted to sides to be way from each other. The bridge portion BR12 is located between the second connection electrodes RE14 and RE15.

In this layout, while the common electrode CE1 and the bridge portion BR11 are located in the same layer as the second connection electrodes RE11 and RE12, the second connection electrodes RE11 and RE12 are shifted to sides to be away from each other. For this reason, it is possible to prevent a short-circuit between the second connection electrodes RE11 and RE12 and the bridge portion BR11. Similarly, a short-circuit between the second connection electrodes RE14 and RE15 and the bridge portion BR12 can also be prevented.

FIG. 14 is a plan view showing another example of a layout of the common electrodes CE1 and CE2, and the second connection electrodes RE11 to RE16.

The layout shown in FIG. 14 is different from the layout shown in FIG. 13 in that the bridge portion BR11 is located between the second connection electrodes RE12 and RE13, and the bridge portion BR12 is located between the second connection electrodes RE15 and RE16.

That is, similarly to the second connection electrode RE3 shown in FIG. 11, the second connection electrodes RE12 and RE15 are shifted to the left side in the drawing relative to drain electrodes DE12 and DE15, respectively. Similarly to the second connection electrode RE2 shown in FIG. 11, the second connection electrodes RE11, RE13, RE14, and RE16 are shifted to the right side in the drawing relative to drain electrodes DE11, DE13, DE15, and DE16, respectively.

Also in this layout, advantages similar to those of the layout shown in FIG. 13 can be obtained.

Figure 15:
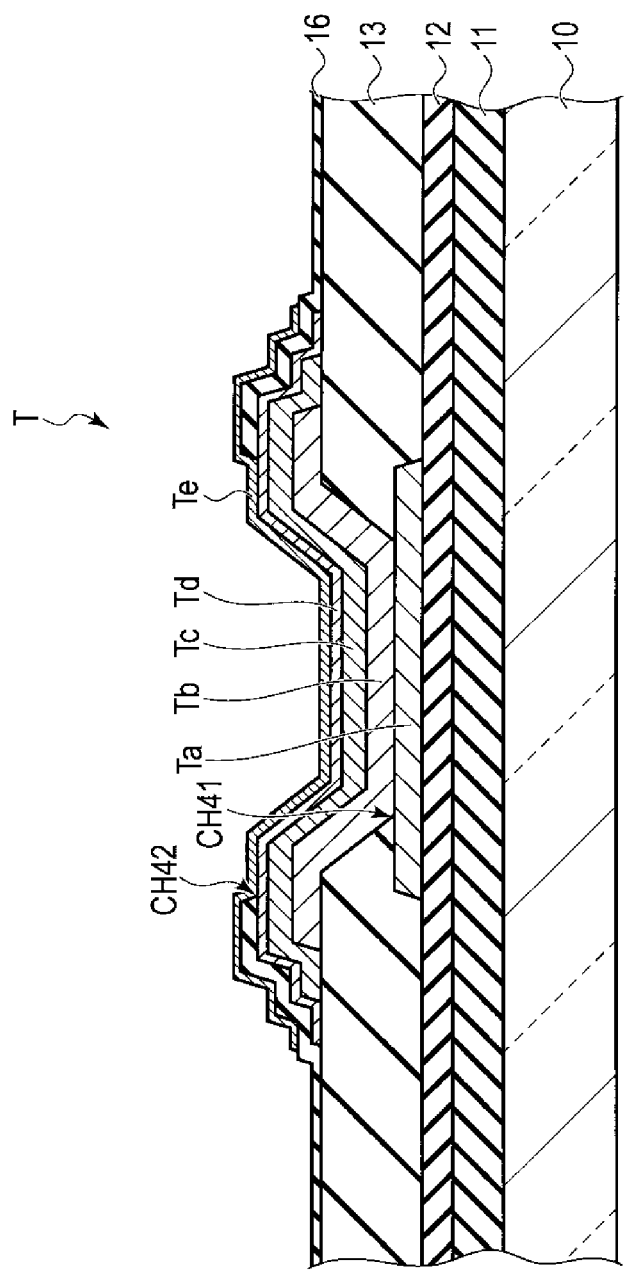
FIG. 15 is cross-sectional view showing an example of a terminal T.

FIG. 15 is a cross-sectional view showing an example of a terminal T. The terminal T is arranged on the mounting portion MA shown in FIG. 1, for example, and is intended to mount signal sources such as the flexible printed circuit 1 and the IC chip 2 on the first substrate SUB1. The terminal T comprises a conductive layer Ta, a conductive layer Tb, a conductive layer Tc, a conductive layer Td, and a conductive layer Te. Of the first substrate SUB1, in an area where the terminal T is arranged, the insulating films 14 and 15 are not arranged. Accordingly, the insulating film 16 is stacked on the insulating film 13.

The conductive layer Ta is located on the insulating film 12, and is covered with the insulating film 13. The conductive layer Ta is located in the same layer as the scanning line G2 shown in FIG. 8, and is formed of the same material as that of the scanning line G2. The insulating film 13 includes a through-hole CH41 penetrated to the conductive layer Ta.

The conductive layer Tb is located on the insulating film 13, and is stacked on the conductive layer Ta which is exposed at the through-hole CH41. The conductive layer Tb is located in the same layer as the signal line S6 shown in FIG. 8, and is formed of the same material as that of the signal line S6.

The conductive layer Tc is stacked on the conductive layer Tb and the insulating film 13, and covers the conductive layer Tb. The conductive layer Tc is located in the same layer as the metal line ML6 shown in FIG. 8, and is formed of the same material as that of the metal line ML6.

The conductive layer Td is stacked on the conductive layer Tc and the insulating film 13, and covers the conductive layer Tc. The conductive layer Td is located in the same layer as the common electrode CE shown in FIG. 8, and is formed of the same material as that of the common electrode CE. The conductive layer Td and the insulating film 13 are covered with the insulating film 16. The insulating film 16 includes a through-hole CH42 penetrated to the conductive layer Td.

The conductive layer Te is located on the insulating film 16, and is stacked on the conductive layer Td which is exposed at the through-hole CH42. The conductive layer Te is located in the same layer as the pixel electrode PE11 shown in FIG. 9, and is formed of the same material as that of the pixel electrode PE11.

According to such a terminal T, the conductive layers Ta, Tb, and Tc that are stacked on a lower surface side of the terminal T are all formed of a metal material. Thus, it is possible to suppress an increase in the contact resistance at the terminal T. Further, according to the terminal T, the conductive layers Td and Te that are located on an upper surface side are both formed of an oxide conductive material such as ITO. Thus, it is possible to prevent the metal material located on the lower surface side of the terminal T from corroding.

As described above, according to the present embodiment, a display device capable of suppressing deterioration in the display quality can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a signal line formed of a metal material;
a drain electrode formed of a same material as the signal line;
a first insulating film including a first through-hole penetrated to the drain electrode, and formed of an organic insulating material;
a first metal layer in contact with the drain electrode inside the first through-hole;
a second insulating film located on the first insulating film, and including a second through-hole overlapping the first through-hole;
a third insulating film located on the second insulating film, and including a third through-hole overlapping the second through-hole;
a metal line located between the first insulating film and the second insulating film, and being formed of a same material as a material of the first metal layer; and
a pixel electrode located on the third insulating film, and electrically connected to the drain electrode via the first to third through-hole,
wherein
the metal line is located directly above the signal line,
the first metal layer is disposed between the drain electrode and a part of the third insulating film inside the first through-hole, and
the part of the third insulating film is located below a position where the first insulating film and the metal line are in contact with each other.

2. The display device of claim 1, wherein:
the first insulating film includes an inclined surface at the first through-hole;
a part of the first metal layer is in contact with the inclined surface; and
a part of the second insulating film covers the inclined surface.

3. The display device of claim 1,
wherein the first through-hole comprises a first portion and a second portion,
wherein the first portion and the second portion horizontally divide the first through-hole;
wherein the first portion comprises a first stacked layer body which includes the drain electrode, the first metal layer, the third insulating film, and the pixel electrode stacked in this order;
wherein the second portion comprises a second stacked layer body which includes the drain electrode, the first metal layer, and the pixel electrode stacked in this order without the third insulating film,
wherein the first stacked layer body and the second stacked layer body are located below the position where the first insulating film and the metal line are in contact with each other.

4. The display device of claim 1, further comprising:
a fourth insulating film having a first surface and a second surface opposed to the first surface,
wherein
the drain electrode and the signal line are between the first insulating film and fourth insulating film, and
the drain electrode and the signal line are located directly on the first surface.

5. The display device of claim 1, wherein
the pixel electrode is electrically connected to the first metal layer below a contact position between the first insulating film and the second insulating film.

6. The display device of claim 1, wherein
an edge of the third through-hole is located inside the second through-hole.

* * * * *